US009533886B2

(12) United States Patent
Hayden et al.

(10) Patent No.: US 9,533,886 B2
(45) Date of Patent: *Jan. 3, 2017

(54) VAPOUR DEPOSITION PROCESS FOR THE PREPARATION OF A PHOSPHATE COMPOUND

(75) Inventors: Brian Elliott Hayden, Chilworth Southampton (GB); Christopher Edward Lee, Chilworth Southampton (GB); Duncan Clifford Alan Smith, Chilworth Southampton (GB); Mark Stephen Beal, Chilworth Southampton (GB); Xiaojuan Lu, Chilworth Southampton (GB); Chihiro Yada, Aichi (GB)

(73) Assignees: Ilika Technologies Ltd., Chilworth, Southampton (GB); Toyota Motor Corporation, Aichi (JP)

( * ) Notice: Subject to any disclaimer, the term of this patent is extended or adjusted under 35 U.S.C. 154(b) by 163 days.

This patent is subject to a terminal disclaimer.

(21) Appl. No.: 14/117,823

(22) PCT Filed: Jul. 20, 2012

(86) PCT No.: PCT/GB2012/051740
§ 371 (c)(1),
(2), (4) Date: Mar. 13, 2014

(87) PCT Pub. No.: WO2013/011326
PCT Pub. Date: Jan. 24, 2013

(65) Prior Publication Data
US 2014/0287160 A1 Sep. 25, 2014

(30) Foreign Application Priority Data
Jul. 21, 2011 (GB) .................. 1112604.2

(51) Int. Cl.
C23C 14/08 (2006.01)
C01B 25/30 (2006.01)
C23C 14/06 (2006.01)
C23C 14/24 (2006.01)
C30B 23/06 (2006.01)
C30B 23/08 (2006.01)
H01M 4/58 (2010.01)
C01B 21/20 (2006.01)
C01B 25/45 (2006.01)
H01M 10/052 (2010.01)

(52) U.S. Cl.
CPC ............ *C01B 25/30* (2013.01); *C01B 21/20* (2013.01); *C01B 25/45* (2013.01); *C23C 14/06* (2013.01); *C23C 14/24* (2013.01); *C30B 23/066* (2013.01); *C30B 23/08* (2013.01); *H01M 4/5825* (2013.01); *H01M 10/052* (2013.01)

(58) Field of Classification Search
None
See application file for complete search history.

(56) References Cited

U.S. PATENT DOCUMENTS

| 2,792,285 A * | 5/1957 | Alexander ............ C01B 25/395 366/107 |
| 4,596,721 A * | 6/1986 | Brock .................... C01B 25/003 427/109 |
| 4,649,024 A | 3/1987 | Brock et al. |
| 4,878,989 A | 11/1989 | Purdes |
| 5,804,054 A | 9/1998 | Bhattacharya et al. |
| 6,911,280 B1 * | 6/2005 | De Jonghe ............ C03C 17/245 429/137 |
| 6,982,132 B1 | 1/2006 | Goldner et al. |
| 8,163,337 B2 | 4/2012 | Guerin et al. |
| 9,067,790 B2 * | 6/2015 | Hayden .................. C23C 14/24 |
| 2002/0001747 A1 | 1/2002 | Jenson et al. |
| 2004/0058237 A1 * | 3/2004 | Higuchi ................ H01M 6/188 429/209 |
| 2005/0042376 A1 * | 2/2005 | Xin ..................... C09K 11/7734 427/255.32 |
| 2005/0229856 A1 * | 10/2005 | Malik ................... C23C 14/246 118/726 |
| 2007/0243338 A1 | 10/2007 | Aslami et al. |
| 2007/0269923 A1 | 11/2007 | Lee et al. |
| 2008/0072962 A1 | 3/2008 | Ishizuka et al. |
| 2009/0061079 A1 * | 3/2009 | Konishiike ........... C23C 14/562 427/78 |
| 2009/0169725 A1 | 7/2009 | Zhamu et al. |

(Continued)

FOREIGN PATENT DOCUMENTS

CN 1447473 A 10/2003
CN 1447475 A 10/2003

(Continued)

OTHER PUBLICATIONS

International Search Report and Written Opinion for Corresponding PCT/GB2012/051740 (mailed Oct. 2, 2012).
Search Report for Corresponding GB 1112604.2 (Nov. 14, 2011).
Hamdi & Ide-Ektessabi, "Dissolution Behavior of Simultaneous Vapor Deposited Calcium Phosphate Coatings in Vitro," Materials Sci. Engineering 27(4):670-674 (2007).
Hamdi et al., "Coating of Hydroxyapatite Thin Film by Simultaneous Vapor Deposition," Thin Solid Films 377-378:484-489 (2000).
Hamdi & Ektessabi, "Influence of Annealing Temperature on Simultaneous Vapor Deposited Calcium Phosphate Thin Films," J. Vac. Sci. Technol. A 19(4):1566-1570 (2001).

(Continued)

*Primary Examiner* — David Turocy
(74) *Attorney, Agent, or Firm* — LeClairRyan, a Professional Corporation

(57) ABSTRACT

The present invention provides a vapour deposition process for the preparation of a phosphate compound, wherein the process comprises providing each component element of the phosphate compound as a vapour, and co-depositing the component element vapours on a common substrate, wherein the component elements react on the substrate to form the phosphate compound.

22 Claims, 8 Drawing Sheets

(56) References Cited

U.S. PATENT DOCUMENTS

| | | |
|---|---|---|
| 2009/0325340 A1 | 12/2009 | Aslami |
| 2010/0037824 A1 | 2/2010 | Lee |
| 2010/0079551 A1 | 4/2010 | Saito et al. |
| 2010/0319777 A1 | 12/2010 | Bae et al. |

FOREIGN PATENT DOCUMENTS

| | | | |
|---|---|---|---|
| GB | 2 350 842 | A | 12/2000 |
| JP | 2002-173307 | A | 6/2002 |
| JP | 2003-277915 | A | 10/2003 |
| JP | 2003-277920 | A | 10/2003 |
| JP | 2003277920 | A * | 10/2003 |
| JP | 2003-532794 | A | 11/2003 |
| JP | 2004-127613 | A | 4/2004 |
| JP | 2005-068554 | A | 3/2005 |
| JP | 2008-120632 | A | 5/2008 |
| WO | 2005/035820 | A1 | 4/2005 |
| WO | 2009/066286 | A2 | 5/2009 |
| WO | 2010-041161 | A1 | 4/2010 |

OTHER PUBLICATIONS

Xu & Baum, "Chemical Vapor Deposition (CVD) of Parylene Films Using Liquid Source Delivery," Mat. Res. Soc. Symp. Proc. 555:155-160 (1999).
Ding & Lanford, "Effects of the Addition of Small Amounts of Al to Copper: Corrosion, Resistivity, Adhesion, Morphology, and Diffusion," J. Apply. Phys. 75(7):3627-3631 (1994).
Eser et al., "Critical Issues in Vapor Deposition of Cu(InGa)Se2 on Polymer Web: Source Spitting and Back Contact Cracking," IEEE Article, pp. 515-518 (2005).
Hong et al., "Gas-Source Molecular Beam Expitaxy of GaInNP/GaAs and a Study of Its Band Lineup," J. Vac. Sci. Technol. B 19(4):1413-1416 (2001).
Weyers & Sato, "Growth of GaAsN Alloys by Low-Pressure Metalorganic Chemical Vapor Deposition Using Plasma-Cracked NH3," Appl. Phys. Lett. 62(12):1396-1398 (1993).
Odnoblyudov & Tu, "Growth and Characterization of AlGaNP on GaP(100) Substrates," Appl. Phys. Lett. 88:071907-1-071907-3 (2006).
Non-Final Office Action, U.S. Appl. No. 14/117,827 (issued as U.S. Pat. No. 9,067,790), 12 pages (mailed Jun. 17, 2014).
Invitation to Pay Additional Fees and Communication Relating to Results of the Partial International Search for PCT/GB2012/051741, 7 pages (mailed Sep. 27, 2012).
Communication and International Search Report and Written Opinion for PCT/GB2012/051741, 15 pages. (Mar. 12, 2015).
International Preliminary Report on Patentability for PCT/GB2012/051741, 9 pages. (Mar. 26, 2015).
Search Report for GB Application No. 1112600.0, 1 page. (Nov. 17, 2011).
Official Action for corresponding Japanese Patent Application No. 2014-520732, 7 pages (Feb. 22, 2016).
Guerin et al., "Physical Vapor Deposition Method for the High-Throughput Synthesis of Solid-State Material Libraries," J. Comb. Chem. 8:66-73 (2006).
Mirsaneh et al., "High Throughput Synthesis and Characterization of the PbnNb2O5+n (0.5<n<4.1) System on a Single Chip," Acta Materialia 59:2201-2209 (2011).
Anderson et al., "Synthesis of the Ferroelectric Solid Solution, Pb(Zr1-xTix)O3 on a Single Substrate Using a Modified Molecular Beam Epitaxy Technique," Applied Physics Letters 90:202907-1-202907-3 (2007).
Mirsaneh et al., "High Dielectric Tunability in Lead Niobate Pyrochlore Films," Applied Physics Letters 100:082901-1-082901-3(2012).
Aljohani et al., "A Simultaneous Screening of the Corrosion Resistance of Ni-W Thin Film Alloys," Electrochimica Acta 111:930-936 (2013).
Guerin et al., "Physical Vapor Deposition Method for the High-Throughput Synthesis of Solid-State Material Libraries," J. Comb. Chem 8(1):66-73 (2006).
Guerin et al., "High-Throughput Synthesis and Screening of Hydrogen-Storage Alloys," J. Comb. Chem 10(1):37-43 (2008).
Yada et al., "A High-Throughput Approach Developing Lithium-Niobium-Tantalum Oxides as Electrolyte/Cathode Interlayers for High-Voltage All-Solid-State Lithium Batteries," J. Electrochem. Soc. 164(4):A722-A726 (2015).
Hayden, B., "The Discovery and Optimisation of Solid State Materials for the Energy and Electronic Sectors using MBE Based Methodologies," NSTI-Nanotech 3:571-574 (2012).
Anderson et al., "Optimization of Synthesis of the Solid Solution, Pb(Zr1-xTix)O3 on a Single Substrate Using a High-Throughput Modified Molecular-Beam Epitaxy Technique," J. Mater. Res. 24(1):164-172 (2009).
Guerin et al., "High-Throughput Synthesis and Screening of Ternary Metal Alloys for Electrocatalysis," J. Phys. Chem. B 110(29):14355-14362 (2006).
Guerin et al., "Combinatorial Approach to the Study of Particle Size Effects in Electrocatalysis: Synthesis of Supported Gold Nanoparticles," J. Comb. Chem. 8(5):791-798 (2006).
Anderson P., "The Quest for New Materials," Materials World, 34-35 (Nov. 2007).

* cited by examiner

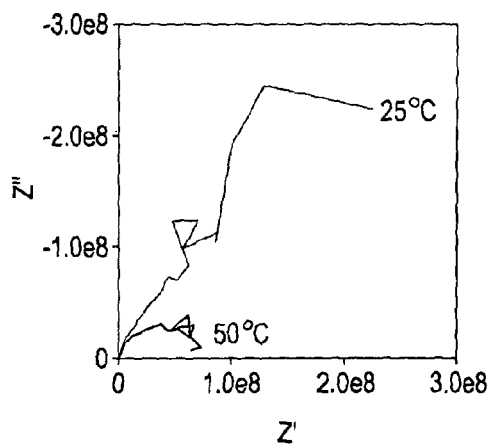
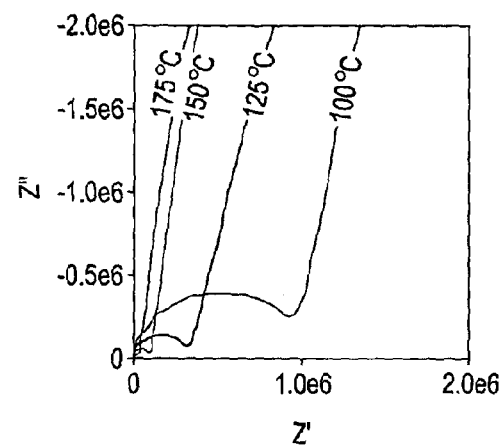
Fig. 4(a)          Fig. 4(b)
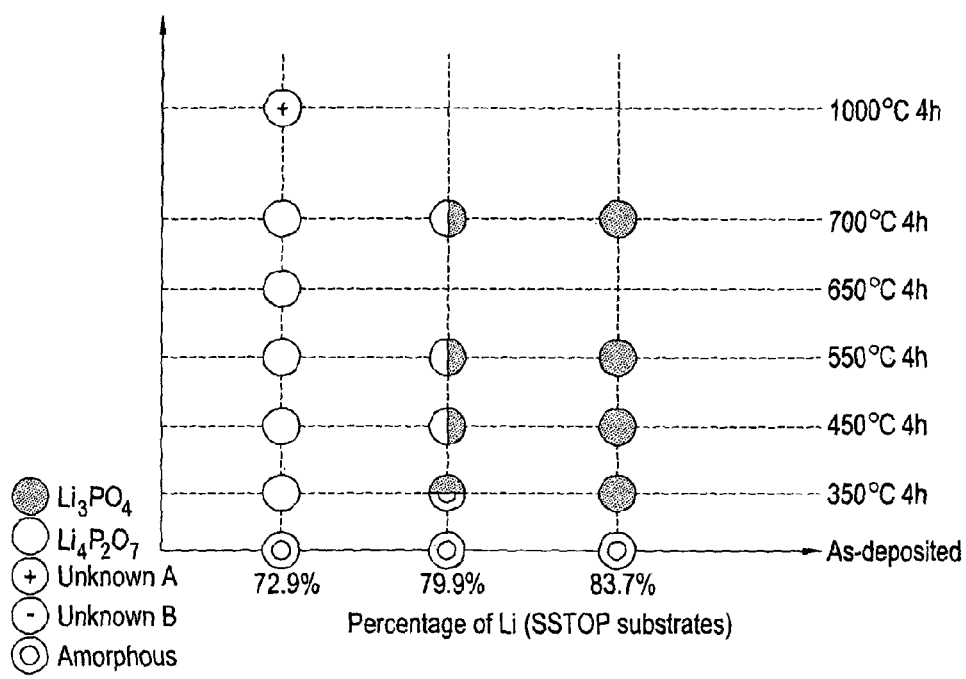
Fig. 5

A VAPOUR DEPOSITION PROCESS FOR THE PREPARATION OF A PHOSPHATE COMPOUND

This application is a national stage application under 35 U.S.C. 0371 of PCT International Application No. PCT/GB2012/051740, filed Jul. 20, 2012, which claims the benefit of Great Britain Patent Application No. 1112604.2, filed Jul. 21, 2011, which is hereby incorporated by reference in its entirety.

The present invention provides a vapour deposition process for the preparation of a phosphate compound. The present invention also provides a process for the manufacture of a battery utilising the vapour deposition process of the present invention.

Complex phosphates are of interest in a number of applications. In particular, complex phosphates such as lithium phosphate, lithium phosphorus oxynitride (LiPON), lithium aluminium metal phosphates (LAMP, $Li_{1+x}Al_xM_{2-x}(PO_4)_3$, M=Ti, Ge) and lithium iron phosphate (LFP, $LiFePO_4$) are of interest for applications in lithium ion battery electrolytes and electrodes (Maccario, M.; Croguennec, L.; Desbat, B.; Couzi, M.; Le Cras, F.; Servant, L. *J. Electrochem. Soc* 2008, 155, A879; Fergus, J. W. *Journal of Power Sources* 2010, 195, 4554; Knauth, P. *Solid State Ionics* 2009, 180, 911). In addition, calcium phosphates (for example, hydroxyapatite ($Ca_{10}(PO_4)_6(OH)_2$)) are of interest to improve bio-compatibility (osseointegration and tissue fixation) of bio-medical implants (Yoshinari, M.; Watanabe, Y.; Ohtshuka, Y.; Derand, T. *J. Dent. Res.* 1997, 76, 1485; Hamdi, M.; Ektessabi, A. M. *J. Vac, Sci, Technol. A* 2001, 19, 1566; Hamdi, M.; Ektessabi, A.-I. *Surface & Coatings Technology* 2006, 201, 3123). Thin film phosphates are of particular interest, in particular in terms of their use in lithium-ion batteries, and especially solid state lithium ion batteries.

Known methods to prepare phosphate materials in the form of thin films generally require the preparation of targets of the phosphate material which are then evaporated onto a substrate using sputtering (Park, H.; Nam, S.; Lim, Y.; Choi, K.; Lee, K.; Park, G.; Lee, S.-R.; Kim, H.; Cho, S. *Journal of Electroceramics* 2006, 17, 1023; Xie, J.; Imanishi, N.; Zhang, T.; Hirano, A.; Takeda, Y.; Yamamoto, O. *Journal of Power Sources* 2009, 192, 689; Lee, J. M.; Kim, S. H.; Tak, Y.; Yoon, Y. S. *Journal of Power Sources* 2006, 163, 173), using plasma laser deposition (PLD) (Kuwata, N.; Iwagami, N.; Matsuda, Y.; Tanji, Y.; Kawamura, J. *ECS Transactions* 2009, 16, 53), or using chemical vapour deposition (CVD) methods (Zhang, J. G.; Meda, L; Maxie, E. System and Method of Producing Thin-Film Electrolyte; B05D 5/12 ed., 2005; Vol. US 2005/0008772A1).

In theory, where a material is deposited on a substrate using a pre-prepared target, for example by sputtering, the chemical composition of the deposited thin film should be the same as that of the pre-prepared target. However, in practice, it is often the case that the deposited material has a different composition to that of the target, due to preferential evaporation of some components from the solid target. As a consequence, it is often difficult to control the exact composition of phosphate thin films. This lack of control presents significant difficulties when trying to optimise the composition of phosphate thin films, and also when trying to reliably reproduce phosphate thin films of a particular composition.

In view of the above, there is a need for a process enabling the reliable and reproducible preparation of phosphate compounds, particularly in the form of phosphate thin films.

It has surprisingly been found that phosphate compounds can be prepared directly from their individual component elements via a vapour deposition process.

SUMMARY OF INVENTION

According to a first aspect, the present invention provides a vapour deposition process for the preparation of a phosphate compound, wherein the process comprises providing each component element of the phosphate compound as a vapour, and co-depositing the component element vapours on a common substrate, wherein the component elements react on the substrate to form the phosphate compound.

In a preferred embodiment of the present invention, the phosphate compound is a metal phosphate or mixed metal phosphate. Preferred metals in this regard are selected from the group consisting of lithium, sodium, magnesium, calcium, a transition metal having an atomic number of 72 or less, aluminium, gallium, indium, germanium, tin, and lead. Particularly preferred metals include lithium, iron, aluminium, titanium, germanium, calcium, tin and cobalt, preferably lithium and iron.

According to a preferred embodiment of the present invention, the phosphate compound is a lithium phosphate, that is a metal phosphate or mixed metal phosphate in which the metal, or at least one of the metals, is lithium. In an embodiment, the phosphate compound is a mixed metal phosphate comprising lithium and iron.

Where the phosphate compound is a metal phosphate or mixed metal phosphate, the metal or metals is/are preferably provided as a vapour using an effusion cell source or using an electron beam evaporator source.

In a preferred embodiment of the present invention, the phosphorus component of the phosphate compound is provided as a cracked phosphorus vapour using a phosphorus cracking source.

According to a preferred embodiment of the present invention, the oxygen component of the phosphate compound is provided as a vapour using a plasma source.

In some embodiments of the present invention, the phosphate compound includes nitrogen. For example, the phosphate compound may be a nitrogen-doped metal or mixed metal phosphate. Where the phosphate compound includes nitrogen, then the nitrogen is preferably provided as a vapour using a plasma source.

According to some embodiments of the present invention, the phosphate compound includes sulphur. Where the phosphate compound includes sulphur, then the sulphur is preferably provided as a cracked sulphur vapour using a sulphur cracking source.

According to a preferred embodiment of the present invention, the stoichiometry of the phosphate compound is controlled by controlling the rate of deposition of each component element onto the substrate.

In some embodiments of the present invention, one or more of the component elements is/are deposited on the substrate with a concentration that varies across at least a portion of the substrate. In this case, a series of phosphate compounds having different stoichiometries can be prepared on said portion of the substrate.

In a preferred embodiment of the present invention, a heated substrate is used. In another preferred embodiment, annealing is carried out following deposition.

According to a second aspect, the present invention provides a process for the manufacture of a battery, wherein the process includes a vapour deposition process according to the first aspect. In a preferred embodiment, the battery is a lithium ion battery.

BRIEF DESCRIPTION OF THE DRAWINGS

FIG. 4 shows the Z vs. Z" plots for a $Li_3PO_4$ sample that was annealed at 350° C. for 4 h in $O_2(g)$ as a function of the sample temperature.

FIG. 5 shows the crystalline phase composition as a function of annealing temperature and sample composition for a series of SSTOP//LiPOx samples.

FIG. 13 shows the area under the $LiMnPO_4$ Raman band ~950 $cm^{-1}$ for an array of samples with variable Li—Mn—P(O) composition.

DETAILED DESCRIPTION

Figure 1A:
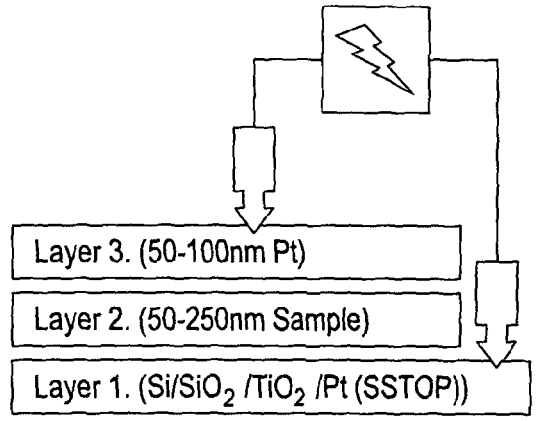
FIG. 1 is a schematic diagram of electrical measurement configurations for (a) through film measurements of ionic conductivity using impedance spectroscopy and (b) half-cell cyclic voltammetry measurements of electrode materials using a multichannel potentiostat and 100 element working electrode array substrate.

According to a first aspect, the present invention provides a vapour deposition process for the preparation of a phosphate compound, wherein the process comprises providing each component element of the phosphate compound as a vapour, and co-depositing the component element vapours on a common substrate, wherein the component elements react on the substrate to form the phosphate compound.

The process according to the present invention offers a number of advantages compared to known methods for the preparation of thin film phosphates. In particular, since each component element of the phosphate compound is provided separately as a vapour, it is possible to control the evaporation rate, and thus deposition rate, of each component element separately. In this way, the preferential evaporation effects which occur during conventional techniques such as sputtering can be compensated for, and the composition of the deposited phosphate compound can therefore be controlled and reproduced in an advantageous manner.

According to the present invention, each component element of the phosphate compound is provided separately as a vapour. The term "element" in this context means "element of the periodic table". Thus, in the case that the phosphate compound is $Li_3PO_4$, for example, then the component elements of the phosphate compound are lithium (Li), phosphorus (P), and oxygen (O). According to the present invention, each of these three component elements would be provided separately as a vapour, that is separate lithium, phosphorus and oxygen vapours would be provided.

Preferably, each component element of the phosphate compound is provided separately as a vapour at a respective source, i.e. one source per component element.

According to the present invention, the separate component element vapours are co-deposited on a common substrate, and react on the substrate to form the phosphate compound. It is an important feature of the present invention that reaction of the component elements to form the phosphate compound occurs on the surface of the substrate, and not in the vapour phase prior to deposition. Without wishing to be bound by theory, it is believed that each component element vapour collides with the surface of the substrate and sticks to the surface. It is believed that the atoms of each component element are mobile on the surface, and so are able to react with atoms of the other component elements, which are also stuck to the surface but mobile thereon, in order to form the phosphate compound.

The process of the present invention is carried out in a vacuum, preferably in an ultra high vacuum (UHV). This ensures that the mean free path of vapour phase particles travelling in the vacuum (that is the mean distance traveled prior to collision with another particle) is long, so that vapour phase collisions between particles are minimised.

In order to minimise or eliminate vapour phase collisions between particles, the distance between each source and the substrate is preferably chosen so that the mean free path of the particles is longer than the distance between the source and the substrate. In this way, the vapour phase component elements can reach the substrate surface substantially without having undergone any vapour phase interactions.

Since there is no significant vapour-phase interaction between the particles, the process of the present invention can essentially be considered to be a physical vapour deposition (PVD) process. It has hitherto not been known to use PVD techniques and equipment to prepare phosphate compounds from their individual component elements on the surface of a substrate.

The substrate for use in the present invention may be selected from suitable clean, flat substrates known to those skilled in the art. The only requirement of the substrate is that it should be compatible with the deposition conditions, for example with the vacuum environment during the deposition process.

Examples of suitable substrates include thermally grown oriented silicon with a native oxide layer (such as available from Nova Electronic Materials), multilayer Si/SiO$_2$/TiO$_2$/Pt (SSTOP) (such as available from Nova Electronic Materials), or multi-electrode electrochemical array substrates (such as available from CIP Technologies).

In addition to the specific substrates mentioned above and other substrates described herein to exemplify the invention, it is possible to envisage a wide range of composite or pure materials for use as the substrate in the present invention. For example, in the case where the present invention is being applied to the manufacture of battery materials, anode or cathode materials may be deposited onto pre-existing components of the battery (one of the electrodes, the electrolyte, a current collector, or a carrier/interlayer for the films deposited according to the present invention). An example of a composite substrate that could be used as the substrate for the present invention is Lithium Ion Conducting Glass Ceramic (LICGC) available from Ohara Corp. In this case, the substrate would typically be the solid state electrolyte, and phosphate electrode materials (e.g., lithium iron phosphate) could be deposited onto the substrate to form the electrolyte/cathode subassembly of a lithium ion battery.

According to preferred embodiments of the present invention, the phosphate compound is a metal phosphate or mixed metal phosphate. In this context, any metal or metals able to form a metal or mixed metal phosphate may be contemplated, the only restriction being that it must be possible to provide the metal or metals as a vapour for deposition on a substrate.

Examples of metals which may be used in the present invention include Group I metals such as lithium, sodium, potassium, rubidium and caesium; Group II metals such as beryllium, magnesium, calcium, strontium and barium; transition metals such as scandium, titanium, vanadium, chromium, manganese, iron, cobalt, nickel, copper, zinc, yttrium, zirconium, niobium, molybdenum, technetium, ruthenium, rhodium, palladium, silver, cadmium, lutetium, hafnium, tantalum, tungsten, rhenium, osmium, iridium, platinum, gold, and mercury; Group XIII metals such as aluminium, gallium and indium; group XIV metals such as germanium, tin and lead; Group XV metals such as bismuth; and Group XVI metals such as tellurium.

Preferred metals which may be used in the present invention are lithium, sodium, magnesium, calcium, transition metals having an atomic number of 72 or less (such as scandium, titanium, vanadium, chromium, manganese, iron, cobalt, nickel, copper, zinc, yttrium, zirconium, niobium, molybdenum, technetium, ruthenium, rhodium, palladium, silver, cadmium, lutetium and hafnium), aluminium, gallium, indium, germanium, tin, and lead. Particularly preferred metals include lithium, iron, aluminium, titanium, germanium, calcium, tin and cobalt.

Lithium and iron are especially preferred metals for use in the present invention, in particular in embodiments in which the phosphate compound is a lithium phosphate or a mixed metal phosphate comprising iron and lithium. Examples of known phosphate compounds in this regard include lithium phosphate, lithium phosphorus oxynitride (LiPON), lithium aluminium metal phosphates (LAMP, $Li_{1+x}Al_xM_{2-x}(PO_4)_3$, M=Ti, Ge) and lithium iron phosphate (LFP, LiFePO$_4$).

Where the phosphate compound is a metal phosphate or mixed metal phosphate, the metal or metals is/are preferably provided as a vapour using an effusion cell source or using an electron beam evaporator source. The choice of source will be made according to the identity of the metal and according to criteria known to those skilled in the art.

Effusion cells (commonly referred to as Knudsen cells or simply K-cells) are well known in the fields of physical vapour deposition (PVD) and molecular beam epitaxy (MBE). Effusion cells may be used to evaporate a very wide range of metals and other elements, and will usually be the preferred source for metals. Electron beam sources (often known simply as e-gun sources) may be more suitable in the case of some metals, including refractory metals such as niobium, molybdenum, tantalum and tungsten.

According to the present invention, the phosphorus is preferably provided as a cracked phosphorus vapour using a phosphorus cracking source ("phosphorus cracker"). By "cracking source" is meant a thermal cracking effusion source. Such sources are sources in which an element that is a solid under standard conditions (i.e. STP, 100 kPa and 273.15 K) is evaporated to form a vapour at a first temperature, and is subsequently cracked to smaller and more reactive species at a substantially higher temperature. The use of such thermal cracking sources provides improved safety for handling toxic materials (such as P4 and P2).

A phosphorus cracker is a known and commercially-available apparatus for converting commercially-available red phosphorus ($P_n$) into a controlled and reproducible flux of highly reactive vapour-phase phosphorus. The basic stages of operation of a phosphorus cracker are evaporation of red phosphorus to form white phosphorus (P$_4$), followed by cracking of P$_4$ to form reactive P$_2$. The white phosphorus vapour may be condensed and re-evaporated, or may be directly transported via a thermal cracking tube at a temperature in excess of 800° C.

Further information regarding cracking sources can be found in F. A. Cotton, G. Wilkinson, C. A. Murillo, M Bochman, "*Advanced Inorganic Chemistry*", 6th Ed., 1999, John Wiley and Sons.

Although phosphorus crackers are the preferred source for phosphorus, other means for depositing phosphorus vapour on a substrate may be contemplated for use in the present invention. Examples of alternative phosphorus sources include P$_2$O$_5$ evaporation (Hamdi, M.; Ektessabi, A.-I. *Surface & Coatings Technology* 2006, 201, 3123) and GaP decomposition (Xiu, F. X.; Yang, Z.; Mandalapu, L. J.; Liu, J. L.; Beyerman, W. P. *Applied Physics Letters* 2006, 88, 052106). However, a phosphorus cracker will generally enable much higher deposition rates than such alternative sources, as well as much better control of the deposition rate. Phosphorus crackers are also advantageous in terms of safety, as well as in terms of the fact that they are available on a much larger scale than alternative source types.

According to a preferred embodiment of the present invention, the oxygen component of the phosphate compound is provided as a vapour using a plasma source (plasma atom source), that is a source for plasma-phase oxygen (i.e. a source of a flux of oxygen atoms, radicals, and ions).

Plasma sources are sources in which an element that is a gas under standard conditions (i.e. STP, 100 kPa and 273.15 K) is transported into a deposition chamber via a tubular RF plasma reactor that excites the vapour using inductively coupled RF excitation, and causes dissociation into neutral atomic species/radicals and ions. This mixture is then directed at a substrate. Further information regarding plasma sources can be found in M. Ohring, "*Materials Science of Thin Films*", 2nd ed., 2002, Ch 4.

Plasma sources, for example RF plasma sources, for oxygen are known and commercially available.

Although plasma sources are the preferred source for active oxygen, other means for depositing oxygen vapour on a substrate may be contemplated for use in the present invention. Examples of alternative oxygen sources include an ozone generator source or oxygen atom beam source.

Ozone generators are sources which provide a flux of ozone, a very reactive oxidising agent which is sometimes used as an alternative to atomic oxygen from a plasma atom source. Examples of ozone generators are described by S. Ischimura et al. in *Thin Solid Films* 377-378, 2000, 518-524 and by SVT Associates Inc. (USA). Oxygen gas is fed via an electrical or UV excitation to a reservoir in which $O_3$ can be trapped at low temperature, and the trapped $O_3$ can then be directed at a surface using a manifold upon warming or release of pressure from the reservoir. During reactions on the surface, $O_3$ may react to form $O_2$ gas and highly reactive O atoms.

An oxygen atom beam source is a source in which oxygen is transported into a deposition chamber via a tubular thermal cracking source. An example of such a device is the "OBS 40" available from Dr. Eberl MBE-Komponenten GmbH (Weil der Stadt, Germany).

The phosphate compounds prepared according to the present invention may include nitrogen. Preferred examples of phosphate compounds containing nitrogen are nitrogen-doped metal or mixed metal phosphates. An example of such a known phosphate compound is lithium phosphorus oxynitride (LIPON).

Where nitrogen is included in a phosphate compound prepared according to the present invention, then it is preferred that the nitrogen be provided as a vapour using a plasma source, that is a source for plasma-phase nitrogen. Plasma sources for nitrogen, for example RF plasma sources, are known and commercially available.

Although it is preferred that each component element of the phosphate compound be provided separately as a vapour at a respective source, i.e. one source per component element, it is possible for a single plasma source to provide the vapours of more than one component element. According to this embodiment, a mixed gas is supplied to the plasma source, and a mixed plasma beam is thus generated. For example, where the phosphate compounds produced according to the present invention include nitrogen, a single plasma source may be used to supply both the oxygen and nitrogen. In this case, a mixture of oxygen and nitrogen is supplied to the plasma source, and a mixed flux of oxygen atoms, radicals and ions and nitrogen atoms, radicals and ions is produced. An advantageous feature of this embodiment of the present invention is that the ratio of the component elements supplied to the substrate by the joint plasma source can be controlled by controlling the ratio of the gases supplied to the plasma source. Thus, for example, nitrogen and oxygen vapours could be deposited on the substrate in a ratio of 1:4 by supplying the plasma source with 25% nitrogen gas ($N_2$) in oxygen gas ($O_2$). As will be apparent to those skilled in the art, essentially any desired ratio could be deposited on the substrate in this manner.

Although it is possible to provide the vapours of more than one component element of the phosphate compound using a single plasma source, it is important to note that the component elements thus provided are nonetheless deposited on the substrate as separate component elements, and only undergo reaction with the other component elements on the substrate. It is an important feature of the present invention that reaction of the component elements to form the phosphate compound only takes place on the substrate, and not in the vapour phase prior to deposition.

Another component element which may be included in a phosphate compound prepared according to the present invention is sulphur. Where sulphur is included in a phosphate compound prepared according to the present invention, then it is preferred that the sulphur be provided as a cracked sulphur using a sulphur cracking source (a "sulphur cracker"). Like the phosphorus cracker already described above, sulphur crackers are known and commercially available. Sulphur crackers operate according to a similar principle to phosphorus crackers, in that a sulphur beam flux is generated from a sulphur source. Thus, elemental sulphur (predominantly $S_8$, although $S_6$ to $S_{20}$ are also present at STP) is evaporated at a first temperature, and is then passed through a second heated stage (e.g. 500 to 1000° C.) to form, for example, $S_7$ (500° C.) or $S_2$ (1000° C.). At much higher second stage temperatures (e.g. 2200° C.), elemental S atoms are predominantly formed in the vapour. Thus, the beam produced by a sulphur cracker may include $S_8$ and also smaller (cracked) sulphur species (e.g. $S_7$, $S_6$, $S_5$, $S_3$, $S_2$, and S). As explained above, the composition of the beam can be controlled by adjustment of the temperature in the cracking zone.

In addition to the component elements discussed above, any other element which is able to be provided as a vapour for deposition on a substrate, and which is able to form a phosphate compound, may be used in the present invention. For example, boron, carbon, silicon, arsenic, antimony and selenium may all be contemplated for use in the present invention. Appropriate source types for these elements may be selected in accordance with known criteria, and may include effusion cells (e.g. for boron), electron beam evaporators (e.g. for carbon and silicon), or cracking sources (e.g. for arsenic, antimony and selenium). Other appropriate source types known to those skilled in the art may also be contemplated.

A key advantage of the present invention is that, since each component element of the phosphate compound is provided separately as a vapour, it is possible to control the evaporation rate, and thus deposition rate, of each component element separately. Accordingly, by controlling the deposition rates of each the component element vapours, the present invention allows the stoichiometry of the phosphate compound to be controlled. Thus, according to a preferred embodiment of the present invention, the stoichiometry of the phosphate compound is controlled by controlling the rate of deposition of each component element onto the substrate.

The means by which the rate of deposition is controlled will depend upon the type of source being used. In the case of an effusion cell, the rate of deposition is controlled by the temperature of the cell, which is both stable and reproducible. In the case of an electron beam evaporator source, the power applied to the sample controls the deposition rate. In the case of plasma sources, the flow rate and plasma power control the deposition rate. In the case of cracking sources, such as phosphorus crackers, the deposition rate is controlled by controlling the flow rate and by controlling the temperature (for example of the cracking zone). Controlling the temperature of the cracking zone in a cracking source also allows the composition of the beam to be controlled (for example, the amount of $P_2$ compared to $P_4$ in a phosphorus beam).

According to another advantageous embodiment of the present invention, one or more of the component elements is/are deposited on the substrate with a concentration that varies across at least a portion of the substrate. This embodiment allows a series of phosphate compounds having different stoichiometries to be prepared on said portion of the substrate. This offers the opportunity to prepare and analyse a library of phosphate compounds, thereby enabling discovery of a phosphate compound which is optimised for a particular application. Once the optimised compound has been discovered, it may be produced according to the present invention by setting the deposition rates of the component elements accordingly. It is envisaged that this technique will facilitate discovery of a range of new and useful thin film phosphate materials, such as battery materials.

In order to deposit one or more of the component elements on the substrate with a concentration (thickness) that varies across at least a portion of the substrate, so-called "wedge shutters" may be employed to partially block the path between a given source and the substrate. The use of wedge shutters in this way is known in the art. According to a particularly advantageous arrangement, it is known that wedge shutters can be positioned between a source and a substrate such that the concentration of the vapour deposited on the substrate varies in a linear manner across the whole surface of the substrate, i.e. avoiding areas of no deposition or of constant deposition (plateaus). This arrangement is described in Guerin, S; Hayden, B. E., *J. Comb. Chem* 2006, 8, 66 and WO 2005/035820, the entire content of both of which is incorporated herein by reference.

The "as-deposited" materials prepared according to the present invention are generally amorphous to X-Rays, and can be partly or completely crystallised using ex-situ annealing treatments. Thus, according to an embodiment of the present invention, annealing is carried out following deposition. It is also possible to deposit onto heated substrates, which promotes in-situ crystallisation in the films. Thus, an embodiment of the present invention employs a heated substrate.

Although it is believed that the process of the present invention will find use in a wide range of applications, it is believed that it may find particular utility in the preparation of batteries, and in particular in the manufacture of thin-film phosphate electrolytes and/or electrodes. Thus, according to a second aspect, the present invention provides a process for the manufacture of a battery, wherein the process includes the vapour deposition process according to the present invention. In a preferred embodiment, the battery is a lithium ion battery.

Many lithium containing phosphates exhibit ionic conduction, and may therefore be considered for use in lithium ion batteries. These materials range from simple lithium ortho-phosphate (Kuwata, N.; Iwagami, N.; Matsuda, Y.; Tanji, Y.; Kawamura, J. *ECS Transactions* 2009, 16, 53) and nitrogen doped materials such as lithium phosphorus oxynitride (LiPON) (Bates, J. B.; Dudney, N. J.; Gruzalski, G. R.; Zuhr, R. A.; Choudhury, A.; Luck, C. F.; Robertson, J. D. *Journal of Power Sources* 1993, 43-44, 103), to complex multi-metallic phases such as the NASICON structures (for example, lithium aluminium germanium phosphate $(Li_{1+x}Al_xGe_{2-x}(PO_4)_3$, LAGP) (Thokchom, J. S.; Gupta, N.; Kumar, B. *Journal of The Electrochemical Society* 2008, 155, A915).

There is currently much interest in the development of solid-state lithium ion batteries. Conventional lithium ion batteries are typically composed of a lithiated carbon anode, a non-aqueous or polymer gel electrolyte, and a lithium cobalt oxide ($Li_xCoO_2$) cathode. Unlike these conventional batteries, solid-state lithium ion batteries employ a solid electrolyte. Solid-state batteries can offer several advantages when compared to conventional batteries, including increased volumetric and gravimetric energy densities, and an increase in the inherent safety of the battery. The fabrication of solid-state lithium ion batteries is traditionally carried out by a complex series of steps starting from separate inks and pellets of the electrode and electrolyte materials (Kobayashi, E.; Plashnitsa, L. S.; Doi, T.; Okada, S.; Yamaki, J. *Electrochem. Comm.* 2010, 12, 2010; Nagata, K.; Nanno, T. *J. Power Sources* 2007, 174, 832). There are also a number of reports describing the use of vacuum deposition methods in the production of solid-state lithium ion batteries (Kuwata, N.; Iwagami, N.; Matsuda, Y.; Tanji, Y.; Kawamura, J. *ECS Transactions* 2009, 16, 53; Xie, J.; Imanishi, N.; Zhang, T.; Hirano, A.; Takeda, Y.; Yamamoto, O.; Zhao, X. B.; Cao, G. S. *Journal of Power Sources* 2010, 195, 8341; Yada, C.; Iriyama, Y.; Abe, T.; Kikuchi, K.; Ogumi, Z. *Electrochemistry Communications* 2009, 11, 413).

The present invention offers an improved method for depositing thin film electrode and/or electrolyte materials, and therefore will be useful in the fabrication of both solid state and conventional batteries. In particular, it is believed that the deposition of thin film electrode and/or electrolyte materials directly from the elements will offer significant advantages compared to known methods using pre-prepared pellets or inks of the electrode/electrolyte materials.

The present invention also provides a means for the discovery and optimisation of new battery materials. Particular reference is made in this regard to the embodiments of the present invention in which one or more of the component elements is/are deposited on the substrate with a concentration that varies across at least a portion of the substrate, thereby enabling a series (library) of phosphate compounds to be prepared across the surface of a substrate. In the context of the discovery and optimisation of battery materials, libraries may be produced according to this methodology and subsequently analysed, in order to identify promising candidate compounds for use as battery materials.

The use of other vacuum deposition methods for the fabrication of, for example, thin film Li ion batteries is described in the literature (for example Bates, J. B.; Dudney, N.J.; Gruzalski, G. R.; Zuhr, R. A.; Choudhury, A.; Luck, C. F.; Robertson, J. D. *Journal of Power Sources* 1993, 43-44, 103 or Kuwata, N.; Iwagami, N.; Matsuda, Y.; Tanji, Y.; Kawamura, J. *ECS Transactions* 2009, 16, 53 and a recent review of electrolytes for solid state micro-batteries Xie, H.; Wang, H. L.; Xiao, W.; Lai, M. O.; Lu, L. *Int. J. Surface Science and Engineering* 2009, 3, 23). In the case of the present invention a battery could be constructed by sequential deposition of an appropriate chemical compound onto a suitable, electrically conductive substrate. For example, sequential deposition of an anode layer (e.g., Li metal (from a Li evaporation source), an electrolyte layer (e.g., $Li_3PO_4$ (prepared using the method disclosed herein)), a cathode layer (e.g. $LiFe(PO_4)$, prepared using the method disclosed herein), and an electrically conductive lop layer (e.g., Pt (from a Pt evaporation source)) could be carried out to provide the layered structure of a thin film battery.

The invention will now be illustrated by means of the following examples, it being understood that these are intended to explain the invention, and in no way to limit its scope.

EXAMPLES

Experimental Methods and Materials

The method for the preparation of metal phosphate thin films described herein is a "physical vapour" co-deposition of the component elements using an appropriate geometric arrangement of elemental sources in a UHV environment. The metallic elements are deposited using either Knudsen cells (K-cells) or Electron Beam Sources (e-guns). Oxygen (and other gaseous elements) is deposited using a plasma source, and phosphorus is deposited using a multi-zone valved phosphorus cracker. The presence of wedge shutters in the path of the elemental sources can be used to create thickness gradients of the component elements on the substrate. The rate of deposition is controlled by the temperature of the K-cell which is stable and reproducible. In an e-gun source, the power applied to the sample controls the deposition rate. In the case of plasma sources, the flow rate and plasma power control the deposition rate. In the case of phosphorus crackers, it is the flow rate and temperature which are used to control the deposition rate.

The deposition rate as a function of position on the substrate is controlled by the wedge shutter. The incorporation of oxygen in the films is accomplished using a plasma atom source that converts $O_2(g)$ into a flux of oxygen atoms, radicals, and ions directed at the substrate.

The "as-deposited" materials are amorphous to X-Rays and can be partly or completely crystallised using ex-situ annealing treatments. It is also possible to deposit onto heated substrates. The use of heated substrates promotes in-situ crystallisation in the films.

Typically, the evaporation temperatures used for the metal components in K-cells are those that achieve a vapour pressure of around $10^{-2}$ Torr. Elements with deposition temperatures above around 1250° C. are usually evaporated using electron beam sources to achieve appreciable deposition rates. Lithium (granules, 99.9%, Sigma Aldrich) was evaporated from a 40 $cm^3$ pyrolytic boron nitride (PBN) crucible in a K-cell at temperatures ranging from 400 to 570° C. Iron was evaporated using an e-gun power of 16.4 to 19.9%, which corresponds to a deposition rate of 1.62-2.24 $Ås^{-1}$ as measured at the source using a quartz crystal microbalance. It is known for the system being used that the deposition rate at the substrate is approximately 0.35× the deposition rate measured near the source.

Oxygen was incorporated into the films using an atom (i.e. plasma) source operating at a power ranging from 300 W to 600 W with an $O_2(g)$ flow rate ranging from 1 to 5 sccm. Phosphorus was deposited using a phosphorus cracker (Veeco EPI-500V-P-IV 500 $cm^3$ valved cracking effusion source) with a white zone temperature ranging from 41.2 to 84.8° C.

The substrates used throughout were 35 mm×35 mm square wafers of approximately 1 mm thickness. The sample films were prepared on thermally grown oriented silicon (100) with a native oxide layer (Nova Electronic Materials), multilayer Si/SiO$_2$/TiO$_2$/Pt (SSTOP) (Nova Electronic Materials), or on multi-electrode electrochemical array substrates (CIP Technologies). To facilitate Raman characterisation and through-film electrical measurements, samples were deposited on SSTOP. The electrochemical array substrates were used for samples that were studied using cyclic voltammetry. Prior to use, all substrates were cleaned using a 50% (v/v) mixture of ethanol and UHP water then 2-propanol, and finally dried with a stream of $N_2(g)$. The substrates were stored in covered Petri dishes until used, to prevent the accumulation of dust particles. To prevent disadvantageous contamination of the samples after synthesis, the samples were purged with Ar(g) and then vacuum packed with a sachet of desiccant.

The analysis of samples was carried out either on a 14×14 or a 10×10 grid with a pitch of 2.0 mm between analysis points. The samples for through-film impedance measurements were made on SSTOP substrates. After deposition of the sample layer, a 14×14 array of Pt contact pads with a diameter of 0.25 mm and a pitch of 2.0 mm were deposited using sputtering (Edwards S150B Sputter Coater). The typical contact pad thickness was approximately 100 nm.

The elemental compositions of samples were measured by Laser Ablation Inductively Coupled Plasma Mass Spectroscopy (ICP-MS) using a Perkin Elmer Elan 9000 ICP-MS equipped with a New Wave 213 nm laser. The ICP-MS analysis was done with reference to a pellet of standard material (e.g., Li$_3$PO$_4$, Sigma Aldrich 99%) or using NIST610 standard reference material. It was found that measurements made using the NIST610 underestimated the phosphorus content of the sample leading to an approximately 5% higher lithium content than the expected values.

The sample thicknesses were measured by ellipsometry (Woollam M-200FI Spectroscopic Ellipsometer). Using deposition times of 30 to 60 min, films were deposited with thicknesses ranging from 50 to 150 nm. The crystalline phase compositions were determined by X-ray diffraction (Bruker D8 diffractometer system equipped with a GADDS detector and a high intensity point source). The 2θ values quoted herein were measured using Cu Kα radiation. A typical collection was done using a 2θ range from 20 to 52° and a collection time of 4 minutes for each field of a 14×14 array sample. The phase composition of the samples was also determined using Raman Spectroscopy (HORIBA Xplora). The use of XRD and Raman spectroscopy provides complementary information about crystalline and amorphous phases in the deposited materials.

A schematic diagram showing the experimental configurations for determining conductivity and electrochemical properties are shown in FIG. 1. The electrical measurements were made using a probe station (Signatone S460) equipped with 2-point probe for DC I(t) measurements and a Solartron 1260 Impedance Analyser for impedance measurements (FIG. 1(a)).

Figure 1B:
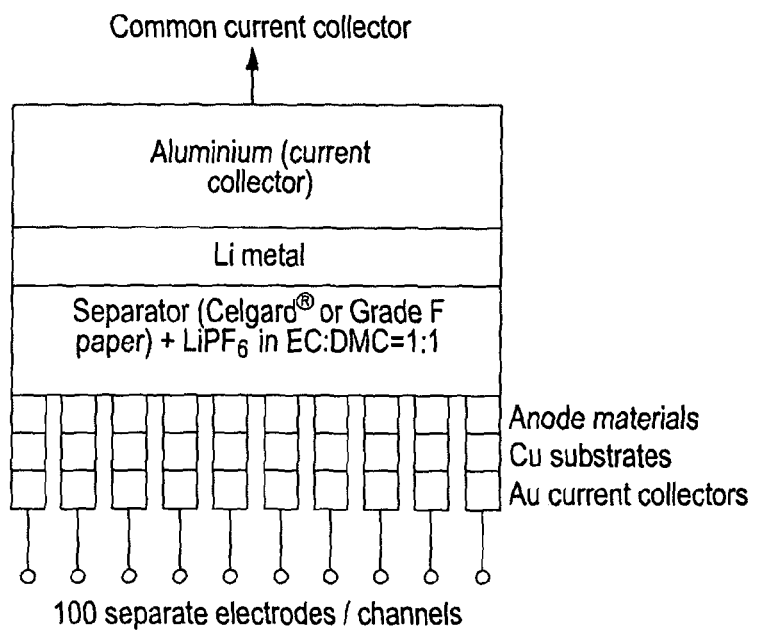

The electrochemical screening of the lithium iron phosphate (LiFePO$_4$, LFP) cathode materials was carried out using a multichannel potentiostat in a ½ cell configuration (FIG. 1(b)). The sample was deposited onto a 10×10 electrochemical array substrate composed of 100 individually addressable 1 mm×1 mm Au electrodes (Guerin, S.; Hayden, B. E.; Lee, C. E.; Mormiche, C.; Russell, A. E. *Journal of Physical Chemistry B* 2006, 110, 14355). The sample was then assembled into a ½ cell using a Celgard® separator soaked in the electrolyte (1 M LiPF$_6$ in 1:1 (vol.) mixture of ethylene carbonate (EC) and dimethylcarbonate (DMC)). A Li foil was applied on top of the electrolyte soaked separator and sandwiched in place with an Al current collector. The general details of the cell construction and electrochemical instrumentation have been described in the literature (Spong, A. D.; Vitins, G.; Guerin, S.; Hayden, B. E.; Russell, A. E.; Owen, J. R. *Journal of Power Sources* 2003, 119-121, 778). The electrochemical cell for testing was assembled in an Ar(g)-filled glove box and all electrical testing was done with the cell inside the glovebox.

Results and Discussion:

In the following Examples, the process of the present invention was used to deposit lithium ortho-phosphate (Example 1), mixtures of lithium ortho- and pyro-phosphates (Example 2), composition gradients containing mixtures of ortho- and pyro-phosphates (Example 3), lithium iron phosphate (Example 5), lithium phosphorus oxynitrides (Example 6), and lithium manganese phosphates (Example 7). A comparison of lithium ortho-phosphate prepared from the elements using the process of the present invention with materials prepared by RF sputtering of a Li$_3$PO$_4$ target (Example 4) is also included to demonstrate the superiority of the method disclosed herein.

Example 1

Deposition and Characterisation of Lithium Ortho-Phosphate ($Li_3PO_4$)

Figure 2:
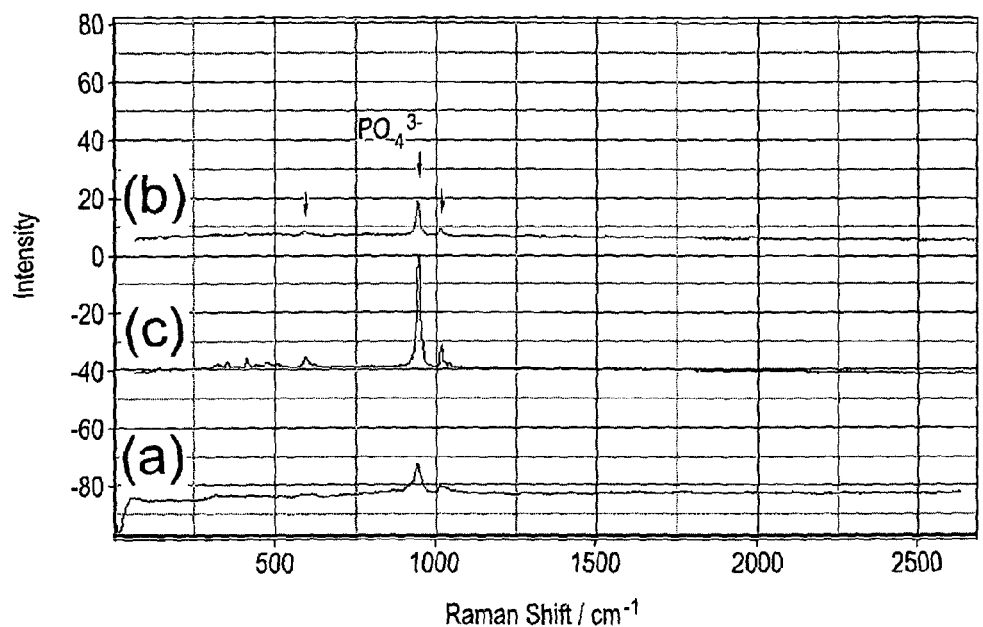
FIG. 2 shows the Raman spectra observed for (a) as-deposited $Li_3PO_4$ and the same sample after annealing at (b) 550° C. and at (c) 700° C. for 4 h in an $O_2(g)$ atmosphere.
Figure 3:
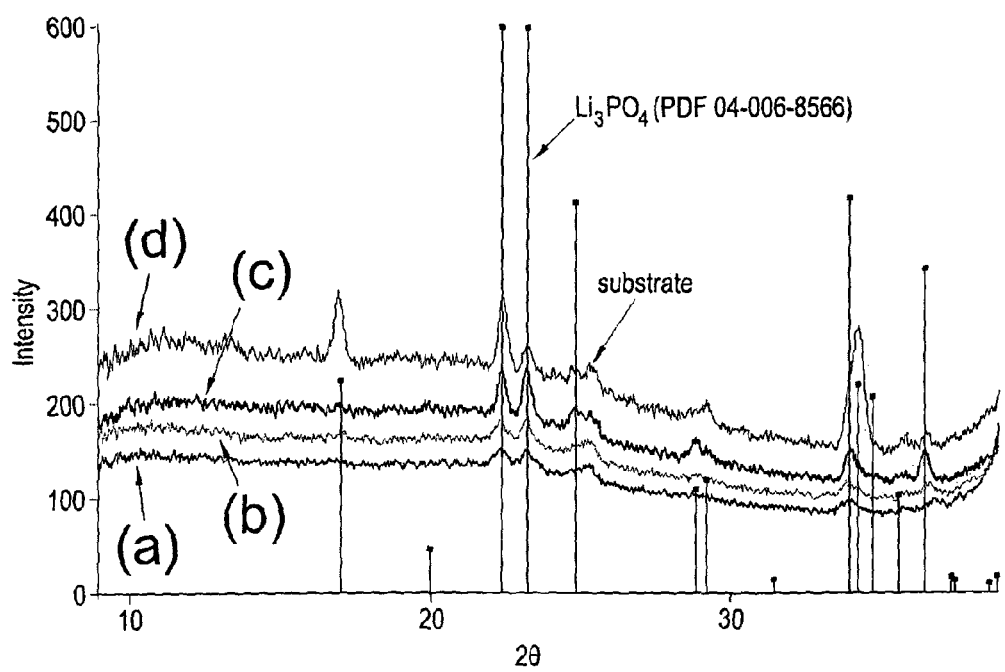
FIG. 3 shows XRD patterns observed for a set of uniform SSTOPI//LiPOx samples (These samples were obtained by dicing a single uniform sample into 9 pieces) after annealing at (a) 350° C., (b) 450° C., (c) 550° C., and (d) 700° C. The samples were annealed using standard conditions (i.e., 3° C. $min^{-1}$, 4 h, in an $O_2$ atmosphere).

A series of uniform composition samples were prepared for characterisation and electrical measurements. The deposition of $Li_3PO_4$ films was achieved by co-depositing Li, P, and O in the appropriate atomic ratios on Si and Si/SiO$_2$/TiO$_2$/Pt (SSTOP) substrates. The evidence for the formation of the phosphate is the observation of the expected Raman bands in the as deposited sample at approximately 950 cm$^{-1}$ and the observation of corresponding X-ray powder patterns in the samples after annealing in an oxygen gas atmosphere (FIGS. 2 and 3). The ionic conductivities of a series of $Li_3PO_4$ samples were measured as a function of annealing temperature. The results of impedance and DC measurements are shown in Table 1.

TABLE 1

The electrical properties of $Li_3PO_4$ thin film samples measured using impedance spectroscopy and DC current decay curves at constant voltage. (N.b., the RAC values correspond to the low frequency Z' at which blocking responses start to be observed).

| $T_{an}$/° C. | T/° C. | $\sigma_{AC}$/S cm$^{-1}$ | $R_{AC}$/Ω | $R_{DC}$/Ω |
|---|---|---|---|---|
| 25 | 25 | 1.11E−07 | 2.54E+05 | 6.46E+07 |
| 350 | 25 | 2.58E−09 | 3.16E+08 | 2.45E+08 |
| 350 | 100 | 2.18E−08 | n/a | n/a |
| 450 | 100 | 5.43E−08 | 8.89E+05 | 8.08E+10 |
| 550 | 25 | 2.69E−09 | 3.62E+08 | 8.62E+09 |
| 550 | 100 | 1.14E−09 | 4.23E+07 | 5.38E+09 |

In FIG. 2, the Raman spectra observed for as-deposited $Li_3PO_4$ and for the same material after annealing at 550 and 700° C. are shown. The bands at approximately 950 and 1025 cm$^{-1}$ indicate the presence of the $PO_4^{3-}$ component of $Li_3PO_4$ and are in agreement with the literature (Popovi, L.; Manoun, B.; de Waal, D.; Nieuwoudt, M. K.; Comins, J. D. *Journal of Raman Spectroscopy* 2003, 34, 77). It is apparent from the non-annealed sample (a) that the target material is formed in the amorphous state during the deposition rather than as a result of chemical reactions occurring during the annealing process. Therefore, the synthesis conditions (i.e., relative amounts of the component elements) determines the phase, and the annealing conditions determine the degree of crystallization (i.e., state) of that phase. The composition of the film determined by ICP-MS is 83.7 At. % Li which is larger than the expected 75 At. % due to a systematic error in the measurement method (see Experimental Methods).

In FIG. 3 the XRD patterns observed for a series of samples after annealing at temperatures from 350° C. to 750° C. are shown. It is apparent from the data shown that the amount of crystalline phase (i.e., degree of crystallisation) of the sample increases with annealing temperature and that no other crystalline phases are present.

The films all have an elemental composition of 75±1 at. % Li relative to P in LiPOx determined using a $Li_3PO_4$ pellet as the standard reference for ICP-MS which alleviated the systematic error mentioned above.

The electrical properties of the samples were determined using impedance spectroscopy and from DC I(t) decay curves at constant voltage. It is thought that the AC impedance gives a measure of the ionic conductivity of the sample (provided a blocking spike is observed in the Z' vs. Z" plot) and that at sufficiently long times the DC resistance gives a measure of the electronic conductivity of the material. The total ionic conductivities and DC resistances of a series of as-deposited (amorphous) $Li_3PO_4$ and of similar annealed samples are shown in Table 1. In most cases the $R_{DC}$ values are at least 1 to 2 orders of magnitude larger than the low frequency $R_{AC}$ values indicating that $Li_3PO_4$ is an ionic conductor with low electronic conductivity which is desired for a suitable solid state electrolyte. These values are in agreement with expectations. In particular, that the ionic conductivity of $Li_3PO_4$ is larger in the amorphous material than in the crystalline or vitreous ceramic states.

In FIG. 4, the Z' vs. Z" plots for a $Li_3PO_4$ sample that was annealed at 350° C. for 4 h in $O_2$(g) are shown as a function of the sample temperature. It is apparent from measurements made at 25 and 50° C. (FIG. 4(*a*)) that the ionic conductivity of the crystalline material is very low. Upon heating above 100° C., the conductivity increased and the blocking spike expected for an ionic conductor is observed. The actual conductivities observed for this range of temperatures are shown in Table 2.

TABLE 2

The total ionic conductivities as a function of temperature for a sample of $Li_3PO_4$ annealed at 350° C.

| $T_{an}$/° C. | $\sigma_{AC}$/S cm$^{-1}$ |
|---|---|
| 25 | 3.86E−09 |
| 50 | 5.40E−09 |
| 100 | 2.18E−08 |
| 125 | 3.75E−08 |
| 150 | 1.25E−07 |
| 175 | 6.53E−07 |

In summary, the physical co-deposition of the elements Li, P, and O using appropriate UHV compatible sources and in the correct atomic ratio results in the formation of the target material (i.e., $Li_3PO_4$) in the amorphous state. This method is superior to other deposition methods.

Example 2

Deposition and Characterisation of Mixtures of Lithium Ortho- and Pyro-Phosphate ($Li_3PO_4$ and $Li_4P_2O_7$)

In a manner similar to Example 1, the deposition of mixed phases (i.e., lithium ortho-phosphate ($Li_3PO_4$) and lithium pyro-phosphate ($Li_4P_2O_7$) films) or pure lithium pyro-phosphate was achieved by co-depositing uniform layers of Li, P, and O in the appropriate atomic ratios on Si and Si/SiO$_2$/TiO$_2$/Pt (SSTOP) substrates. In FIG. 5 the results of XRD analysis of a series of LiPOx samples with Li contents ranging from 72.9 to 83.7 at. % Li are shown as a function of annealing temperature (Note: The compositions were measured vs. NIST 610 and thus have a systematic error that over estimates the Li content relative to P by approximately 5 at. %). It is apparent from this data that the nature of the material synthesised depends, among other things, primarily on the atomic composition of the film. The composition of each specific point on the sample is determined by the relative deposition rates of the component elements at that point, which rates are identical across the sample field.

Example 3

Figure 6:
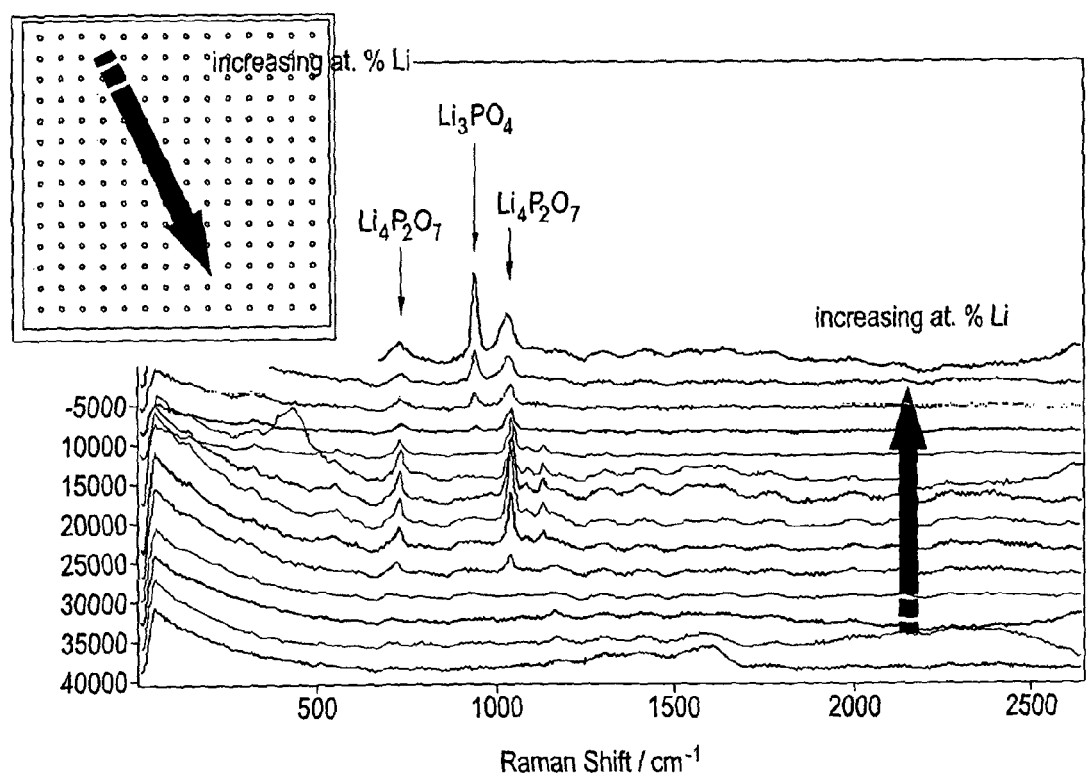
FIG. 6 shows the Raman spectra of a gradient SSTOP//LiPO film after annealing to 350° C. The spectra were recorded along the diagonal composition gradient. The Li content varies as indicated by the arrows. The bands assigned to $PO_4^{3-}$ and $P_2O_7^{4-}$ are indicated by the arrows.

Deposition and Characterisation of Mixtures of Lithium Ortho- and Pyro-Phosphate $Li_3PO_4$ and $Li_4P_2O_7$) as Gradients on a Single Substrate The co-deposition of a gradient of Li metal in the presence of atomic P and O produces a compositional variation across the sample substrate. This method of physical vapour deposition is termed Wedge Growth PVD (or HT-PVD). As shown above (Example 1), conclusive evidence for the formation of the target lithium phosphates is the observation of the expected Raman spectrum for the materials. According to the wedge growth effect, the composition of a specific point on the sample is determined by the relative deposition rates of the component elements at that point, which in this example is determined by the wedge gradient imposed on the Li source. A gradient composition sample was prepared in which a constant flux of oxygen and phosphorus was present during the deposition of a gradient in the Li content. The Raman spectra obtained as a function of position (and thus composition) on the substrate are shown in FIG. 6. The spectra were obtained from a gradient sample after annealing at 350° C.

In Summary, using the method it is possible to prepare pure Li phosphates and mixtures of ortho- and pyro-phosphate phases in an amorphous state. In this context "amorphous" refers to a state of the material that lacks sufficient long range order to produce a X-ray diffraction pattern.

Example 4

Comparison of Sputtered Deposited Lithium Ortho-Phosphate with Similar Materials Prepared Using the Method A set of lithium phosphate thin films was prepared using RF sputtering to provide a comparison with the materials prepared according to the present invention. The samples were deposited onto a platinum coated silicon substrate (Si/SiO$_2$Cr/Pt). The thickness of the samples ranged from 220±21 nm to 358±16 nm depending on the deposition time. The sputtered Li$_3$PO$_4$ samples are visually uniform samples across most of the film, the bands of colour around the edges of the film are a result of a thickness gradient in this region. Annealing of the films resulted in the formation of a mottled surface. Such large changes in the optical appearance of the samples were not observed after annealing of SSTOP// LiPOx samples prepared using the physical vapour deposition (PVD) method disclosed herein. The phase composition of the sputtered samples was analysed using XRD and Raman spectroscopy. The as-deposited sputtered Li$_3$PO$_4$ samples showed the presence of P$_2$O$_5$ in XRD measurements. This phase has not been observed on Li$_3$PO$_4$ samples prepared using PVD. After annealing at 350° C. the sputtered sample showed lighter and darker regions. The XRD patterns observed in the two regions are similar and can be assigned to a mixture of Li$_3$PO$_4$ and LiPt$_7$. After annealing at 450° C. the sample appears rough and mottled. The XRD patterns show the presence of a mixture of Li$_3$PO$_4$, Li$_2$PtO$_3$, Li$_2$C$_2$O$_4$ and AlPO$_4$. The presence of an aluminium phase in the sample is unexpected and may arise from the crucible used in the annealing process. Analysis of the sputtered samples by Raman spectroscopy confirmed the presence of the PO$_4^{3-}$ from the $v_1$ band at approximately 950 cm$^{-1}$, but the spectra are rather more complex than those observed for vapour deposited materials.

Impedance and DC measurements were made on the sputtered samples using the same conditions as for the SSTOP//LiPOx samples prepared by HT-PVD. The results are summarised in Table 3. As is the case for the vapour deposited materials, the ionic conductivity was found to decrease significantly upon annealing. The electrical resistance of the sputtered sample annealed at 450° C. was too large to be determined. The electrical properties of the as-sputtered Li$_3$PO$_4$ material are similar to those of the as-prepared vapour-deposited lithium phosphate. The R$_{DC}$ values are approximately 2 orders of magnitude higher than the R$_{AC}$ values and the total ionic conductivities of both materials are approximately 10$^{-7}$ S cm$^{-1}$. Upon annealing the total ionic conductivities of the sputtered samples decrease more significantly, which is likely due to the presence of significant amounts of secondary phases as shown by XRD.

TABLE 3

The electrical properties of sputtered Li$_3$PO$_4$ thin film samples measured using impedance spectroscopy and DC current decay curves at constant voltage.

| T$_{an}$/° C. | T/° C. | σ$_{AC}$/S cm$^{-1}$ | R$_{AC}$/Ω | R$_{DC}$/Ω |
|---|---|---|---|---|
| 25 | 25 | 1.31E-07 | 5.65E+05 | 5.83E+08 |
| 350 | 100 | 3.12E-09 | 5.49E+07 | 2.76E+09 |
| 450 | 100 | n/a | n/a | n/a |

In summary, samples of sputtered Li$_3$PO$_4$ are not identical to vapour deposited Li$_3$PO$_4$ prepared using the method of the present invention. The XRD analysis of sputtered and vapour-deposited Li$_3$PO$_4$ samples shows significant differences. The complex mixture of phases observed for annealed sputtered samples is not observed for Li$_3$PO$_4$ samples prepared using HT-PVD. Also, the presence of Li and Pt phases (e.g., Li$_2$PtO$_3$) is not observed for vapour-deposited LiPOx samples. The sputtered samples contain a more complex phase composition and are shown to have lower total ionic conductivities after annealing compared to phase pure Li$_3$PO$_4$ prepared using physical vapour deposition. It is also possible that differences in sample handling procedures and substrate effects also contribute to the observed differences. In the physical vapour deposition process, elemental sources are used to provide a flux of each component element at the target substrate. Upon impact with the substrate (and assuming an effective sticking probability of unity), the absorbed elements are mobile and react with each other to form the target material (provided the appropriate deposition conditions and substrate are selected). In the case of sputtering the chemistry is done ahead of the deposition process. That is, the target material is evaporated by the incident plasma and clusters of the material are vaporised and then deposited on the substrate. A significant difference between these methods is that using our physical vapour deposition method the relevant reactions occur on the surface of the substrate. Although some reactions may proceed to a minute extent in the gas phase, these are not routes to the target material.

Example 5

Deposition and Characterisation of Lithium Iron Phosphate

The method disclosed herein is not limited to the preparation of simple binary phosphates (e.g., LiPO$_4$). It is known that lithium iron phosphate is a useful cathode material for Li ion batteries. In a manner similar to the lithium phosphates described above, the deposition of lithium iron phosphate (LiFe(PO$_4$), LFP) was achieved by co-depositing Li, Fe, P, and O in the appropriate atomic ratios on Si and Si/SiO$_2$/TiO$_2$/Pt (SSTOP) substrates. The evidence for the formation of the target phosphate is the observation of the expected Raman bands in the as deposited sample at approximately 950 cm$^{-1}$ and the observation of corresponding X-ray powder patterns in the samples after annealing in argon-hydrogen gas atmosphere. Further, the property of interest in these studies was the specific capacity which was measured as a function of sample composition using a high throughput electrochemical ½ cell method.

Figure 7A:
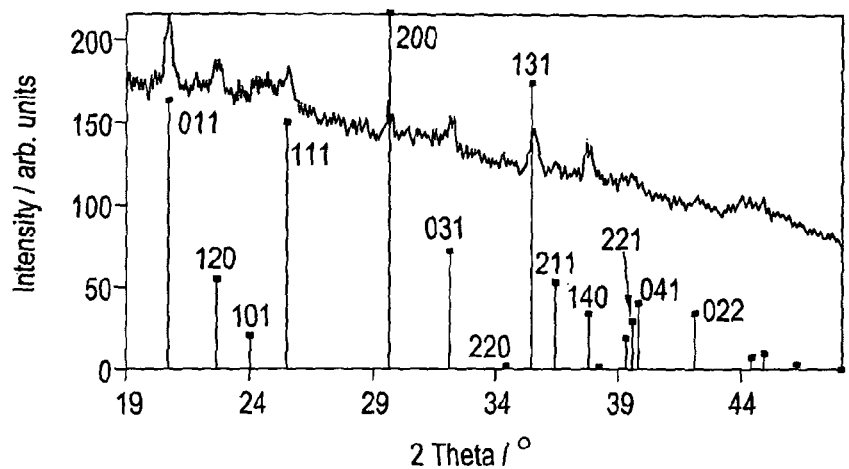
FIG. 7 shows (a) a typical XRD Pattern for a $LiFePO_4$ obtained from analysis of a 10×10 array and (b) the integrated area under the main $LiFePO_4$ peak as a function of composition.
Figure 7B:
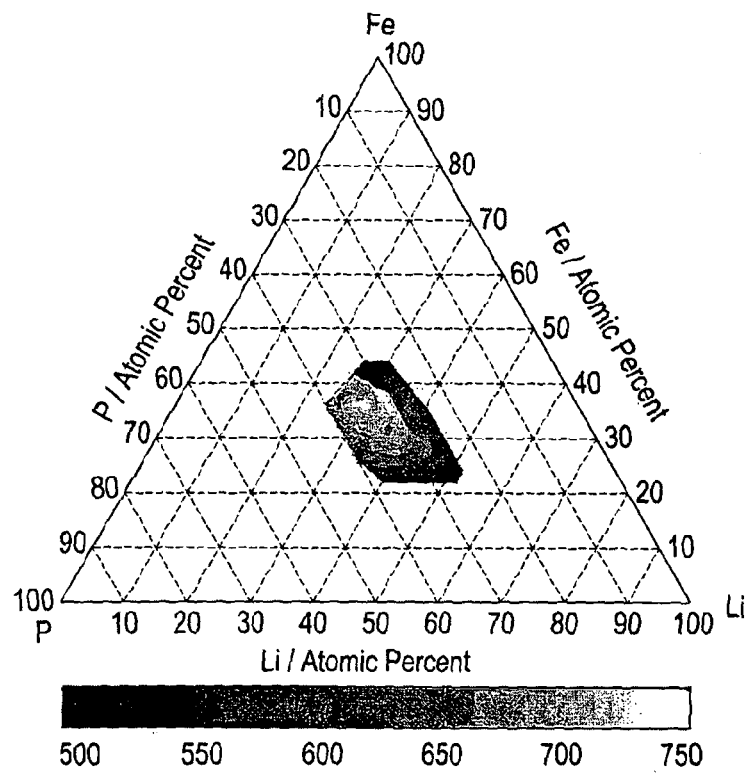
Figure 8A:
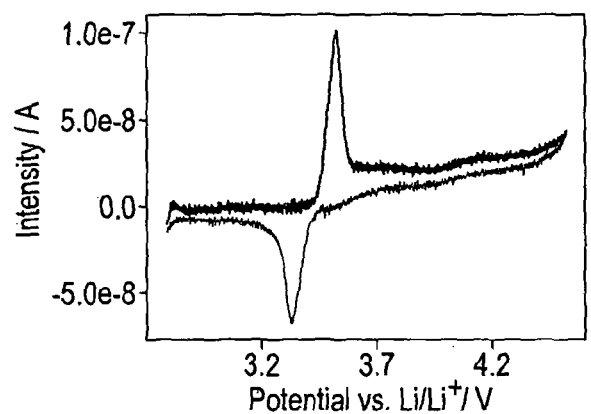
FIG. 8 shows (a) a typical voltammogram from a 10×10 array recorded at 0.05 mV $s^{-1}$ between 2.8 and 4.3 V vs. Li/Li+ is shown. In (b) the $1^{st}$ discharge capacities extracted from voltammograms measured for the range of compositions studied are shown. The specific capacities were calculated using thicknesses measured by optical profilometry and assuming the sample is 100% dense $LiFePO_4$ (d=3.6 g $cm^{-3}$).
Figure 8B:
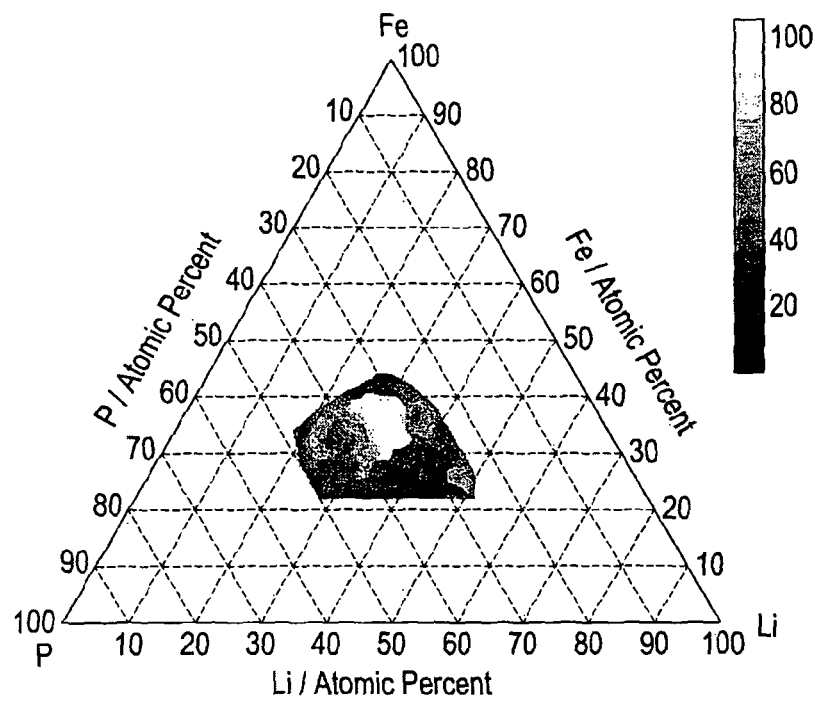

The XRD data shown in FIG. 7 demonstrate that single phase olivine LiFePO$_4$ is obtained after annealing the as-deposited (amorphous) sample in 95:5 Ar:H$_2$ for 6 h at 500° C., though the relative intensities are different from reported values due to preferential orientation of the material on the substrate. The observed capacity was 100 mAhg$^{-1}$, which is lower than the theoretical capacity of 169 mAhg$^{-1}$. The XRD characterisation and electrochemical measurements on LFP thin films prepared using the method show that the target phase is formed and that the specific capacity as a function of composition (FIG. 8) is in general agreement with the literature (Padhi, A. K.; Nanjundaswamy, K. S.; Goodenough, J. B. *Journal of The Electrochemical Society* 1997, 144, 1188).

Example 6

Deposition and Characterisation of Lithium Phosphorus Oxynitrides

Thin films of lithium phosphorus oxynitride (LiPON) are usually prepared by sputtering of lithium ortho-phosphate in a nitrogen environment (Yu, X., Bates, J. B., G. E. Jellison, J., Hart, F. X., *Journal of the Electrochemical Society* 1997, 144, 524).

Figure 9:
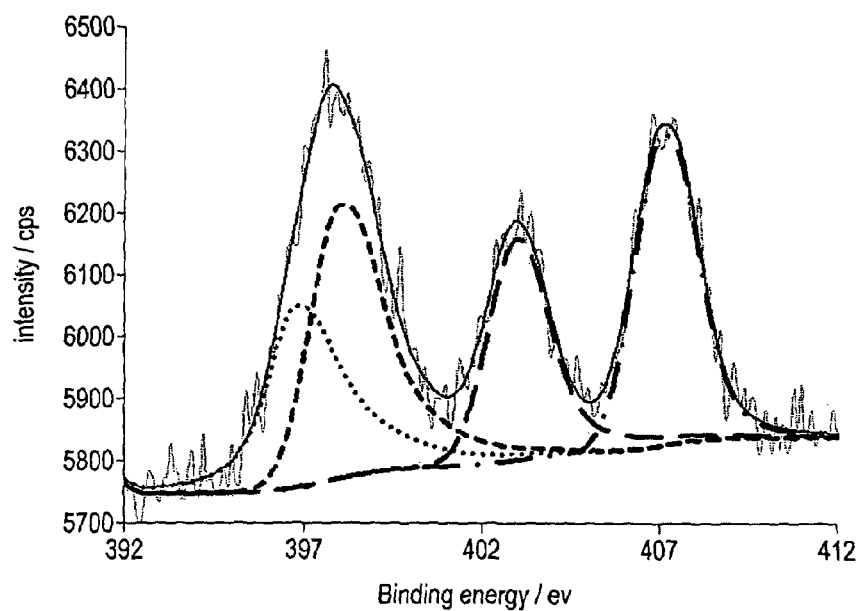
FIG. 9 shows the XPS spectrum for the N1s region for a sample containing 66 at. % Li (relative to phosphorus) prepared using 25% $N_2$ in $O_2$. The fitted peaks show the different N bonds present on the surface of the sample.

A series of graded composition samples were prepared by co-depositing Li, P, O and N for characterisation on SSTOP substrates. The amounts of nitrogen and oxygen were varied by altering the ratio of molecular oxygen to molecular nitrogen in the supply to the plasma source. The evidence for the formation of the phosphate is the observation of the expected Raman bands in the as deposited sample at approximately 950 cm$^{-1}$ (Popovi, L., Manoun, S., de Waal, D., Nieuwoudt, M. K., Comins, J. D. *Journal of Raman Spectroscopy* 2003, 34, 77). The evidence for the incorporation of nitrogen to form the lithium phosphorus oxynitride is the observation of the expected N1 s peaks using X-Ray Photoelectron Spectroscopy as shown in FIG. 9. The peak at 397 eV can be assigned to the doubly-bonded N, whilst the peak at 399 eV can be assigned to the triply-bonded N to P, which are known to form part of the bonding network in the amorphous lithium phosphorus oxynitride materials.

The ionic conductivities were measured for a sample prepared with pure molecular oxygen and a sample prepared using 5% nitrogen at 75° C. and found to be 1×10$^{-6}$ S cm$^{-1}$ and 1×10$^{-5}$ S cm$^{-1}$ respectively. Thus the incorporation of nitrogen shown in this example leads to an improvement in the conductivity of 1 order of magnitude.

In summary, the physical co-deposition of the elements Li, P, O and N using appropriate UHV compatible sources and in the correct atomic ratio results in the formation of the target materials (LiPON) in the amorphous state. This method is superior to other deposition methods due to the degree of control of the elemental composition and other reasons that will be clear to those skilled in the art of thin film deposition methods.

Example 7

Deposition and Characterisation of Lithium Manganese Phosphates

In a manner similar to the lithium iron phosphates described above, the deposition of lithium manganese phosphate (LiMnPO$_4$, LFP) was achieved by co-depositing Li, Mn, P, and O in the appropriate atomic ratios on (SSTOP) substrates. The evidence for the formation of the target phosphate is the observation of the expected Raman bands in the as deposited sample at approximately 950 cm$^{-1}$ and the observation of corresponding X-ray powder patterns in the samples after annealing in an argon-hydrogen gas atmosphere.

Figure 10:
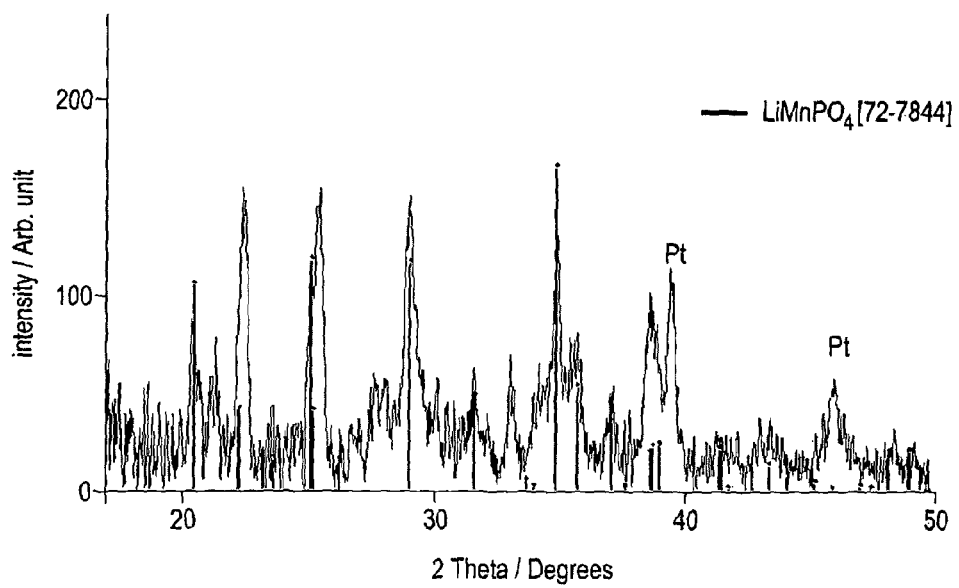
FIG. 10 shows the XRD pattern of an $LiMnPO_4$ sample annealed at 600° C. in Ar, 3 hours.

The XRD data shown in FIG. 10 demonstrate that single phase olivine LiMnPO$_4$ is obtained after annealing the as-deposited (amorphous) sample in Ar for 3 h at 600° C., though the relative intensities are different from reported values due to preferential orientation of the material on the Pt substrate (marked).

Figure 11:
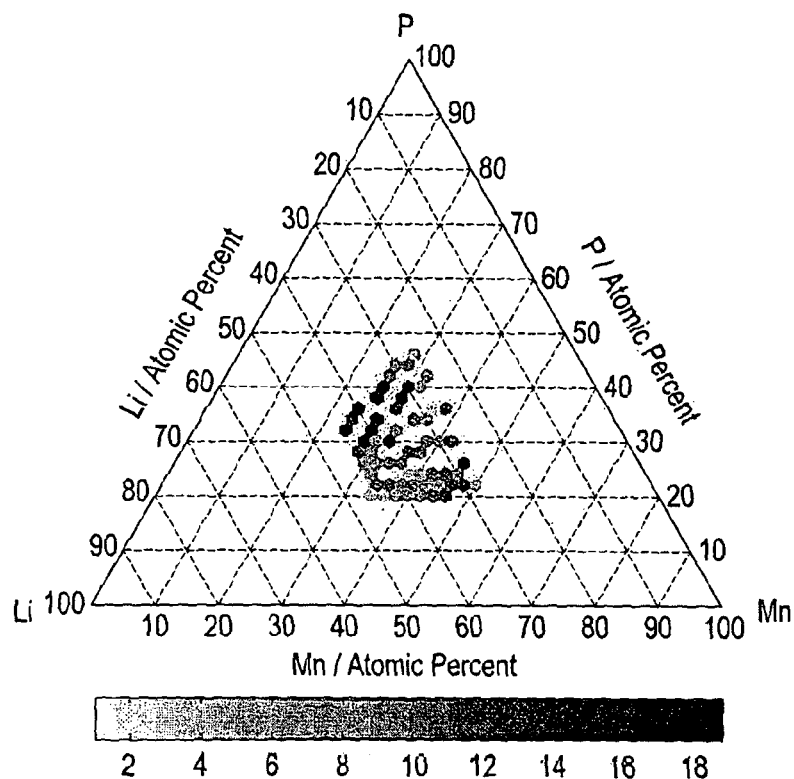
FIG. 11 shows the area under the $LiMnPO_4$ [111] XRD peak for an array of samples with variable Li—Mn—P(O) composition.

The area under the LiMnPO$_4$ [111] XRD peak is shown in FIG. 11 for an array of Li—Mn—P—O materials with graded compositions. This parameter shows the predominance of LiMnPO$_4$ materials with the olivine crystal structure in the nominal area of the Li—Mn—P(O) ternary diagram (i.e., Li:Mn:P=1:1:1) which is in good agreement with literature data.

Figure 12:
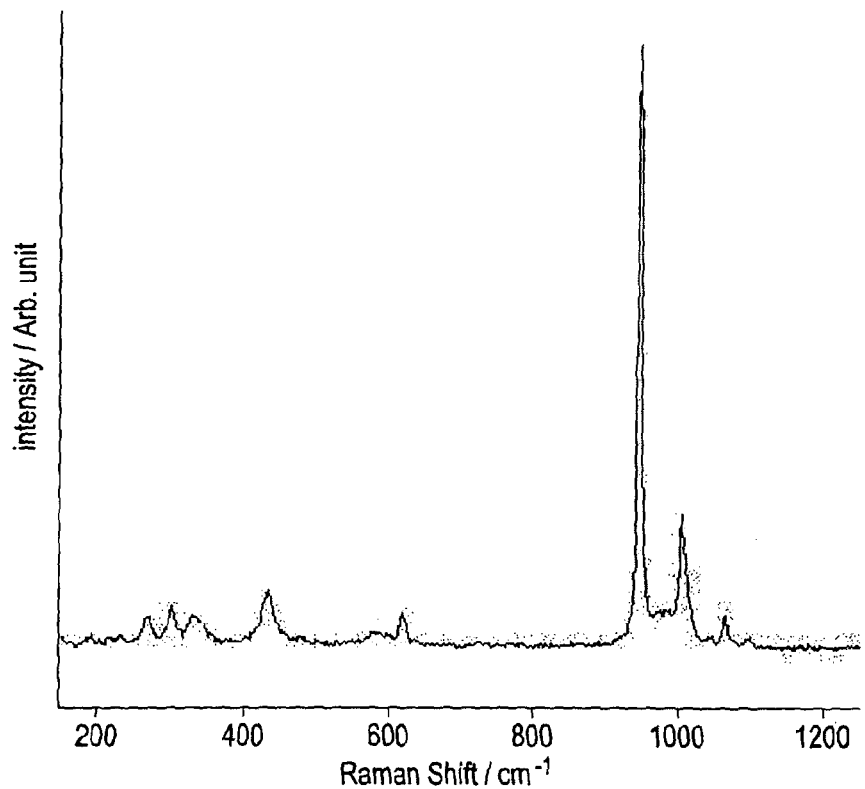
FIG. 12 shows the Raman spectrum of a $LiMnPO_4$ sample annealed at 600° C. in Ar, 3 hours.

A typical Raman spectrum for LiMnPO$_4$ material is shown in FIG. 12 and is in good agreement with reported literature data. The area under the LiMnPO$_4$ Raman band at ~950 cm$^{-1}$ is shown in FIG. 13 for an array of Li—Mn—P—O materials with graded compositions. This parameter shows the predominance of LiMnPO$_4$ materials with the olivine crystal structure in the nominal area of the Li—Fe—P(O) ternary diagram, i.e. Li:Mn:P=1:1:1, in good agreement with literature data.

The invention claimed is:

1. A physical vapour deposition process for the preparation of a phosphate compound, wherein the process comprises:
   providing each component element of the phosphate compound as a vapour from a source, wherein the component elements comprise vapour phase particles having a mean free path that is longer than the distance between the source and a common substrate, thereby minimizing vapour phase collision between the vapour phase particles, and
   co-depositing the component element vapours on the common substrate, wherein the component elements react on the substrate to form the phosphate compound.

2. A physical vapour deposition process according to claim 1, wherein the phosphate compound is a metal phosphate or mixed metal phosphate.

3. A physical vapour deposition process according to claim 2, wherein the metal or metals is/are provided as a vapour using an effusion cell source or using an electron beam evaporator source.

4. A phsyical vapour deposition process according to claim 2, wherein the metal or metals is/are selected from lithium, sodium, magnesium, calcium, a transition metal having an atomic number of 72 or less, aluminium, gallium, indium, germanium, tin, and lead.

5. A physical vapour deposition process according to claim 4, wherein the metal or metals is/are selected from lithium, iron, aluminium, titanium, germanium, calcium, tin and cobalt.

6. A physical vapour deposition process according to claim 1, wherein the phosphate compound is a lithium phosphate.

7. A physical vapour deposition process according to claim 1, wherein the phosphate compound is a mixed metal phosphate comprising lithium and iron.

8. A physical vapour deposition process according to claim 1, wherein phosphorus is provided as a cracked phosphorus vapour using a phosphorus cracking source.

9. A physical vapour deposition process according to claim 1, wherein oxygen is provided as a vapour using a plasma source.

10. A physical vapour deposition process according to claim 1, wherein the phosphate compound includes nitrogen.

11. A physical vapour deposition process according to claim 10, wherein the phosphate compound is a nitrogen-doped metal or mixed metal phosphate.

12. A physical vapour deposition process according to claim 10, wherein the nitrogen is provided as a vapour using a plasma source.

13. A physical vapour deposition process according to claim 1, wherein the phosphate compound includes sulphur.

14. A physical vapour deposition process according to claim 13, wherein the sulphur is provided as a cracked sulphur vapour using a sulphur cracking source.

15. A physical vapour deposition process according to claim 1, wherein the stoichiometry of the phosphate compound is controlled by controlling the rate of deposition of each component element onto the substrate.

16. A physical vapour deposition process according to claim 1, wherein one or more of the component elements is/are deposited on the substrate with a concentration that varies across at least a portion of the substrate.

17. A physical vapour deposition process according to claim 16, wherein a series of phosphate compounds having different stoichiometries is prepared on said portion of the substrate.

18. A physical vapour deposition process according to claim 1, wherein a heated substrate is used.

19. A physical vapour deposition process according to claim 1, wherein annealing is carried out following deposition.

20. A physical process for the manufacture of a battery, wherein the process includes a physical vapour deposition process according to claim 1.

21. A process according to claim 20, wherein the battery is a lithium ion battery.

22. A physical vapour deposition process according to claim 1, wherein the vapour of at least one component element is supplied using a cracking source and the vapour of at least one other component element is supplied using a plasma source.

* * * * *